(12) United States Patent
Tsukamoto et al.

(10) Patent No.: US 7,592,776 B2
(45) Date of Patent: *Sep. 22, 2009

(54) ENERGY STORAGE DEVICE CONFIGURED TO DISCHARGE ENERGY IN RESPONSE TO UNSAFE CONDITIONS

(75) Inventors: Hisashi Tsukamoto, Saugus, CA (US); Clay Kishiyama, Burbank, CA (US); David Comarow, Las Vegas, NV (US)

(73) Assignee: Quallion LLC, Sylmar, CA (US)

( * ) Notice: Subject to any disclaimer, the term of this patent is extended or adjusted under 35 U.S.C. 154(b) by 663 days.

This patent is subject to a terminal disclaimer.

(21) Appl. No.: 10/935,869

(22) Filed: Sep. 8, 2004

(65) Prior Publication Data

US 2005/0029990 A1    Feb. 10, 2005

Related U.S. Application Data

(63) Continuation of application No. 10/357,671, filed on Feb. 3, 2003, now Pat. No. 6,891,353, which is a continuation-in-part of application No. PCT/US02/35698, filed on Nov. 6, 2002, which is a continuation-in-part of application No. 10/014,757, filed on Nov. 7, 2001, now Pat. No. 6,531,847, application No. 10/935,869, which is a continuation-in-part of application No. PCT/US03/00565, filed on Jan. 8, 2003.

(51) Int. Cl.
*H01M 10/46*    (2006.01)
(52) U.S. Cl. ...................................... 320/136
(58) Field of Classification Search ................ 320/134, 320/136, 147, 150, 153, 154
See application file for complete search history.

(56) References Cited

U.S. PATENT DOCUMENTS

| | | | |
|---|---|---|---|
| 2,999,969 A | * | 9/1961 | Fritzinger et al. ........... 320/147 |
| 3,207,631 A | | 9/1965 | Zaromb |
| 3,537,907 A | | 11/1970 | Wilson |

(Continued)

FOREIGN PATENT DOCUMENTS

EP    0 806 806 A1    11/1997

(Continued)

*Primary Examiner*—Edward Tso
(74) *Attorney, Agent, or Firm*—Gavrilovich Dodd & Lindsey, LLP

(57) ABSTRACT

A method, device and system is disclosed for rapidly and safely discharging remaining energy stored in an electrochemical battery 104 in the event of an internal short circuit or other fault. In its best mode of implementation, if a sensor 116 detects one or more parameters such as battery temperature 204 or pressure 206, exceeding a predetermined threshold value 334, the terminals 144 of the battery or cell are intentionally short-circuited external to the battery through a low or near zero resistance load 150 which rapidly drains energy from the battery 104. Heat generated by such rapid drain is absorbed by a heat absorbing material 151 such as an endothermic phase-change material like paraffin. The rate energy is drained via the external discharge load 150 may be controlled with an electronic circuit 136 responsive to factors such as state of charge and battery temperature. Devices such as inductive charging coils 160, piezoelectric and Peltier devices 300, may also be used as emergency energy discharge loads. Heat absorption material 163 may be used to protect adjacent issue in medically-implanted devices.

55 Claims, 9 Drawing Sheets

U.S. PATENT DOCUMENTS

| | | | |
|---|---|---|---|
| 4,022,952 A | 5/1977 | Fritts | |
| 4,075,400 A | 2/1978 | Fritts | |
| 4,314,008 A | 2/1982 | Blake | |
| 4,741,979 A | 5/1988 | Faust et al. | |
| 5,158,841 A | 10/1992 | Mennicke et al. | |
| 5,343,368 A | 8/1994 | Miller | |
| 5,478,667 A | 12/1995 | Shackle et al. | |
| 5,625,273 A | 4/1997 | Fehling et al. | |
| 5,684,663 A | 11/1997 | Mitter | |
| 5,763,118 A | 6/1998 | Stafford et al. | |
| 5,766,793 A | 6/1998 | Kameish et al. | |
| 5,898,356 A | 4/1999 | Gascoyne et al. | |
| 6,010,800 A | 1/2000 | Stadnick et al. | |
| 6,074,774 A | 6/2000 | Semmens et al. | |
| 6,127,438 A | 10/2000 | Hasegawa et al. | |
| 6,172,482 B1 | 1/2001 | Eguchi | |
| 6,210,824 B1 | 4/2001 | Sullivan et al. | |
| 6,242,893 B1 | 6/2001 | Freedman | |
| 6,252,762 B1 | 6/2001 | Amatucci | |
| 6,268,713 B1 | 7/2001 | Thandiwe | |
| 6,468,689 B1 | 10/2002 | Hallaj et al. | |
| 6,586,912 B1 | 7/2003 | Tsukamoto et al. | |
| 6,596,433 B2 | 7/2003 | Gudmundsson et al. | |
| 6,627,344 B2 | 9/2003 | Kang et al. | |
| 2001/0016289 A1 | 8/2001 | Oura et al. | |
| 2004/0004464 A1 | 1/2004 | Tsukamoto et al. | |

FOREIGN PATENT DOCUMENTS

| | | | |
|---|---|---|---|
| EP | 0 806 806 B1 | | 1/2002 |
| JP | 55-111060 | A2 | 8/1980 |
| JP | 55-119346 | A2 | 9/1980 |
| JP | 55-119347 | A2 | 9/1980 |
| JP | 56-028463 | A2 | 3/1981 |
| JP | 56-162473 | A2 | 12/1981 |
| JP | 56-162474 | A2 | 12/1981 |
| JP | 57-072272 | A2 | 5/1982 |
| JP | 57-138774 | A2 | 8/1982 |
| JP | 59-063668 | A2 | 10/1982 |
| JP | 58-082462 | A2 | 5/1983 |
| JP | 58-097255 | A2 | 6/1983 |
| JP | 58-128652 | A2 | 8/1983 |
| JP | 58-209059 | A2 | 12/1983 |
| JP | 59-090353 | A2 | 5/1984 |
| JP | 59-128774 | A2 | 7/1984 |
| JP | 60-025157 | A2 | 2/1985 |
| JP | 60-077350 | A2 | 5/1985 |
| JP | 61-147473 | A2 | 7/1986 |
| JP | 62-154555 | A2 | 7/1987 |
| JP | 01-140558 | A2 | 6/1989 |
| JP | 02054861 | A2 | 2/1990 |
| JP | 02-075152 | A2 | 3/1990 |
| JP | 02-148577 | A2 | 6/1990 |
| JP | 04-206339 | A2 | 11/1990 |
| JP | 07-029563 | A2 | 1/1995 |
| JP | 07-094189 | A2 | 4/1995 |
| JP | 07-130347 | A2 | 5/1995 |
| JP | 07-130349 | A2 | 5/1995 |
| JP | 07-272702 | A2 | 10/1995 |
| JP | 07-272717 | A2 | 10/1995 |
| JP | 08-106886 | A2 | 4/1996 |
| JP | 08-138635 | A2 | 5/1996 |
| JP | 08-241709 | A2 | 9/1996 |
| JP | 09-237616 | A2 | 9/1997 |
| JP | 10-031997 | A2 | 2/1998 |
| JP | 10-050348 | A2 | 2/1998 |
| JP | 10-064548 | A2 | 3/1998 |
| JP | 10-064549 | A2 | 3/1998 |
| JP | 10-139918 | A2 | 5/1998 |
| JP | 10-279717 | A2 | 10/1998 |
| JP | 11-204151 | A2 | 7/1999 |
| JP | 11-238518 | A2 | 8/1999 |
| JP | 11-240970 | A2 | 9/1999 |
| JP | 11-268118 | A2 | 10/1999 |
| JP | 11-307081 | A2 | 11/1999 |
| JP | 2000-100450 | A2 | 4/2000 |
| JP | 2000-285873 | A2 | 10/2000 |
| JP | 2001-043893 | A2 | 2/2001 |
| JP | 2001-060465 | A2 | 3/2001 |
| JP | 2001-060466 | A2 | 3/2001 |
| JP | 2001-307688 | A2 | 11/2001 |
| WO | WO 03/041208 | A1 | 5/2003 |
| WO | WO 03/061032 | A2 | 7/2003 |
| WO | WO 03/061032 | A3 | 7/2003 |

\* cited by examiner

ENERGY STORAGE DEVICE CONFIGURED TO DISCHARGE ENERGY IN RESPONSE TO UNSAFE CONDITIONS

REFERENCE TO PRIOR-FILED APPLICATIONS

This application is a Continuation of U.S. patent application Ser. No. 10/357,671, filed Feb. 3, 2003, and issued as U.S. Pat. No. 6,891,353 on May 10, 2005 which is a Continuation-in-Part of PCT Application PCT/US02/35698 filed Nov. 6, 2002, which is a Continuation-in-Part of U.S. patent application Ser. No. 10/014,757 filed Nov. 7, 2001 and issued as U.S. Pat. No. 6,531,847 on Mar. 11, 2003; and this patent application is also a Continuation-in-Part of PCT Application PCT/US03/00565 filed Jan. 8, 2003, which claims priority to U.S. patent application Ser. No. 10/042,898 filed Jan. 9, 2002, and issued as U.S. Pat. No. 6,586,912 on Jul. 1, 2003 the disclosure of each of which is incorporated herein by reference in its entirety.

TECHNICAL FIELD

The invention relates generally to electrochemical storage cells (hereinafter referred to as "batteries"), and more particularly to safety circuits and systems to rapidly drain energy from a battery in the event of a fault or other malfunction.

BACKGROUND

Batteries are now in use in a wide range of applications. This range of applications is expected to increase in the future as storage battery technology, particularly energy density, continues to improve. In recent years, implanted biomedical batteries have become important for powering so-called bionic devices such as cochlear implants, neuromuscular stimulators, cardiac pacemakers and defibrillators, and artificial organs. In addition, batteries have become an essential power source in a wide range of portable electronic devices including computers, personal information managers, radio telephones ("cellular telephones"), global positioning satellite (GPS) devices, and other devices that combine the functions of the foregoing. The safety of these devices is paramount as the explosion of a battery in any of these devices could cause injury and death.

Batteries may present certain safety problems under a variety of circumstances. These potential problems can become more acute, even life threatening, when they are implanted in a human being. These problems may include internal short-circuits, over-pressure leading to bulging enclosures, electrolyte leaks, explosion, over-heating and combustion. Such faults can result from both internal and external factors. They cannot be tolerated in any implanted battery, and could lead to serious safety problems in any application.

The present invention is fundamentally an emergency energy drain or "dump" system. That is, in the event of a serious fault such as an internal short circuit, the remaining energy in the battery is quickly discharged by diverting it to a discharge radiator or sink acting to safely dissipate or absorb the heat generated by the current so diverted. While it is commonly accepted in the art that rapidly draining a battery would cause it to dangerously increase its heating, tests have shown that this counter-intuitive approach is highly effective in preventing dangerous over-heating and/or rupture of batteries that experience an internal short circuit.

The present invention is particularly suited for human-implantable batteries, however may be applied to any electrochemical storage device, or even inertial energy storage devices such as flywheels.

Battery safety circuits and devices in general are widely used in both primary (disposable) and secondary (rechargeable) batteries and charging circuits. The circuits typically limit charging and discharging, or disconnect a battery in the event of over-heating or over-pressure in the battery. These devices are intended to prevent real-world failures, but are also designed to meet certain industry and regulatory test requirements such as nail penetration and mechanical crush tests.

U.S. Pat. No. 6,210,824 issued to Sullivan, et al., for example, discloses an end-cap incorporating a pressure sensitive switch intended to disconnect the battery from a circuit in the event pressure inside the battery casing becomes excessive.

Similarly, U.S. Pat. No. 5,766,793 issued to Kameishi et al. discloses a bi-metal plate that bends when heated due to overcharging or short circuiting, breaking the external circuit.

U.S. Pat. No. 6,242,893 issued to Freedman discloses a battery charging circuit which interrupts the charging or discharging of a battery to prevent over-charging or over-discharging.

U.S. Pat. No. 6,268,713 issued to Thandiwe discloses a method wherein a battery charger controller (circuit) detecting a fault isolates one or more batteries while simultaneously notifying a user or host device.

U.S. Pat. No. 5,898,356 issued to Gascoyne et al. discloses a thermally-activated switch which by-passes a cell with an open circuit.

U.S. Pat. No. 6,172,482 issued to Eguchi discloses a battery protection circuit comprising a thermally-activated fuse intended to prevent over-charging.

U.S. Pat. No. 5,684,663 issued to Mitter discloses a resettable circuit intended to protect a battery pack from an external short by disconnecting the battery pack from the faulty load by means of a control FET until the fault is cleared.

Similarly, U.S. Pat. No. 5,625,273 issued to Fehling et al. discloses a latching circuit intended to disconnect an external device from the battery in the event of sensing a fault (over-heating, voltage reversal or short circuit).

Each of the foregoing approaches fails to mitigate over-heating caused by a short circuit internal to a battery (as opposed to battery heating caused by an external short). Such faults are generally addressed in the industry by a so-called "safety separator" made of a porous material that, when heated to a specific temperature, fuses (becomes impermeable) and electrically isolates a cathode from an anode, shutting down the electrochemical reaction. For example, U.S. Pat. No. 6,127,438 issued to Hasegawa, et al. discloses a safety separator made of polyethylene microporous film with high tensile strength, a 20-80%, porosity, a gel fraction of 1% or more and an average pore diameter determined by the permeation method of 0.001-0.1 µm, and a method for producing same. The separator so disclosed fuses (becomes impermeable) at between 100° C. (212° F.) and 160° C. (320° F.). Additionally, the separator disclosed is claimed to have a breaking time of 20 seconds in silicone oil at 160° C. (320° F.). There are numerous other variations of safety separators used in the industry. A short circuit resulting from faulty manufacture, however, such as a contaminant lodged in the components of a battery during assembly creating a hole in the separator, growth of dendrites within the battery or crushing or penetration of the battery can defeat the safety features of the safety separator, causing a runaway condition and overheating.

The large flow of current through such an internal short can cause heat and pressure to rise dramatically inside the battery.

Each of the foregoing prior art approaches (both the use of safety circuits and safety separators) further suffers from the problem that the energy stored in the battery may continue to over-heat the battery, causing a build-up in pressure, explosion or combustion resulting in rupture of the battery enclosure, and/or leaks of electrolyte. Thus, a means of preventing a runaway condition in the event of the failure or breach of a safety separator would be highly beneficial.

U.S. Pat. No. 5,478,667 issued to Shackle, et al. discloses a heat dissipation scheme in which the current collectors of a battery serve as a heat sink to help dissipate to the atmosphere heat generated inside the battery. However, such an arrangement is impractical for small batteries, especially those that are medically implanted. Moreover, such a thermal sink would likely not dissipate heat quickly enough in the event of an internal short circuit, especially one caused by a sudden penetration or crushing event. Thus, a passive heat sink such as described in the '667 patent would likely not prevent a runaway condition and may not be adequate to prevent electrolyte leaks, explosions or even combustion.

A better approach not found in the prior art is to provide an emergency energy drain method or device intended to intentionally rapidly deplete stored energy to minimize further battery heating and resulting damage.

SUMMARY

The best mode of the present invention comprises a control circuit and sensors which detect faults such as over-heating and over-pressure. If such conditions persist, even if the external load is disconnected, electrolyte leakage, explosion, and combustion can occur. Therefore, once the control circuit detects conditions above predetermined thresholds, it connects the faulty cell or cells to an energy "dump" or discharge device (hereinafter referred to as "discharge device") such as a heat sink or heat dissipation device such as a low resistance coil. In medically implanted devices, it is advantageous to provide a heat absorption material ("HAM") around the discharge device to minimize heating of adjacent tissue. Such HAM preferably takes the form of paraffin or other material with an endothermic melting phase change at about between 42° C. and 80° C. Since the preferred embodiment of the claimed device is automatic, it is advantageous to provide a notification that it has been activated. This is particularly true when life-dependent devices (such as implanted cardiac defibrillators) will necessarily need to be replaced or serviced without delay. The present invention can also be implemented as a manually activated system.

In addition, the present invention is equally applicable to related energy storage devices such as super capacitors and so-called "asymmetric hybrid devices" (see e.g., U.S. Pat. No. 6,252,762 issued to Amatucci).

Accordingly, it is an object of the present invention to provide a safety device and method to prevent the dangerous build-up of heat and pressure in batteries that experience internal short circuits.

A more particular object of the present invention is to provide a means for draining rapidly and safely remaining stored energy in a battery in the event of an internal fault.

It is further an object of the present invention to provide a means of notifying a user or operator that a battery fault has occurred.

In one aspect of the present invention, an emergency energy discharge system is provided comprising: at least one energy storage device; at least one detecting device for monitoring one or more operating parameters of said energy storage device; means for storing predetermined safety threshold values for operating parameters of said energy storage device; comparison means for comparing said predetermined safety threshold values with said operating parameters; decision means for determining whether said operating parameters exceed one or more said predetermined operating threshold values; activation means responsive to decision means; energy discharge device for discharging said energy stored in said energy storage device so as to render said energy storage device safe before the fault or faults causing said monitored operating parameters to exceed said safety threshold values renders the energy storage device unsafe; and heat absorbing material thermally coupled to said energy discharge device. The heat absorbing material may have a melting point about between 42° C. and 80° C, and may comprise an endothermic phase-change material, which may comprise paraffin. The heat absorbing material may comprise at least one material selected from the group consisting of: paraffin, polypropylene, polyethylene, $SiO_2$, and water. The heat absorbing material and energy discharge device may be mutually encapsulated in a sealed enclosure. The emergency energy discharge device may comprise a Peltier device.

In another aspect of the present invention, a battery safety circuit is provided comprising: one or more first electrochemical cells; at least one sensor monitoring at least one of the following conditions of said one or more first electrochemical cells: voltage, change in voltage, rate of change in voltage, current, change in current, rate of change in current, state of charge, change in state of charge, rate of change in state of charge, temperature, change in temperature, rate of change in temperature, impedance, change in impedance, rate of change in impedance, pressure, change in pressure, rate of change in pressure, electrolyte pH, electrolyte specific gravity, amount of bulging of battery enclosure, change in amount of bulging of battery enclosure, and rate of change of amount of bulging of battery enclosure; memory storage; predetermined safety thresholds for said at least one condition; a comparator circuit; a control circuit; a diverter switch device; ,an energy discharge load; heat absorbing material closely thermally coupled to said energy discharge load; said comparator circuit comparing said monitored conditions with .said stored predetermined safety thresholds and signaling said control circuit whenever said at least one monitored condition exceeds one or more said predetermined thresholds; said control circuit sending an emergency energy discharge signal to said diverter switch device in response to signal from said comparator circuit; and said diverter switch device causing electrodes of said one or more cells having conditions exceeding said predetermined thresholds to be connected to said energy discharge load. The heat absorbing material may comprise an endothermic phase change material, which may comprise paraffin. The heat absorbing material may comprise at least one material selected from the group consisting of: paraffin, polypropylene, polyethylene, $SiO_2$, and water. The heat absorbing material and energy discharge load may be mutually encapsulated in a sealed enclosure.

In another aspect of the present invention, a battery is provided comprising: one or more electrochemical cells; a charging circuit; a charging control circuit; an electronic device receiving its power from said one or more electrochemical cells; an emergency energy discharge circuit further comprising at least one sensor monitoring at least one of the following conditions of said electrochemical cells: voltage, change in voltage, rate of change in voltage, current, change in current, rate of change in current, state of charge, change in state of charge, rate of change in state of charge, temperature, change in temperature, rate of change in temperature, impedance, change in impedance, rate of change in impedance, pressure, change in pressure, rate of change in pressure, electrolyte pH, electrolyte specific gravity, amount of bulging of battery enclosure, change in amount of bulging of battery enclosure, and rate of change of amount of bulging of battery enclosure; memory storage; predetermined safety thresholds for said at least one condition stored in said memory storage; a comparator circuit; a control circuit; a diverter switch; an electrical discharge load; said comparator circuit comparing said monitored conditions with said stored predetermined safety thresholds and signaling said control circuit whenever said at least one monitored condition exceeds one or more said predetermined thresholds; said emergency discharge circuit sending an emergency energy discharge signal to said diverter switch in response to signal from said comparator circuit; said diverter switch causing electrodes of said one or more cells having conditions exceeding said predetermined thresholds to be connected to said energy discharge load. The battery may be implantable, and the electronic device may also be implantable. The battery may further comprise heat absorbing material, which may be thermally coupled to said electrical discharge load, may have a melting point about between 42° C. and 80° C. and may comprise an endothermic phase-change material, which may comprise paraffin. The heat absorbing material may comprise at least one substance selected from the group consisting of: paraffin, polypropylene, polyethylene, SiO2, and water. The heat absorbing material and electrical discharge load may be mutually encapsulated in a sealed enclosure.

DETAILED DESCRIPTION AND PREFERRED EMBODIMENTS

Figure 1:
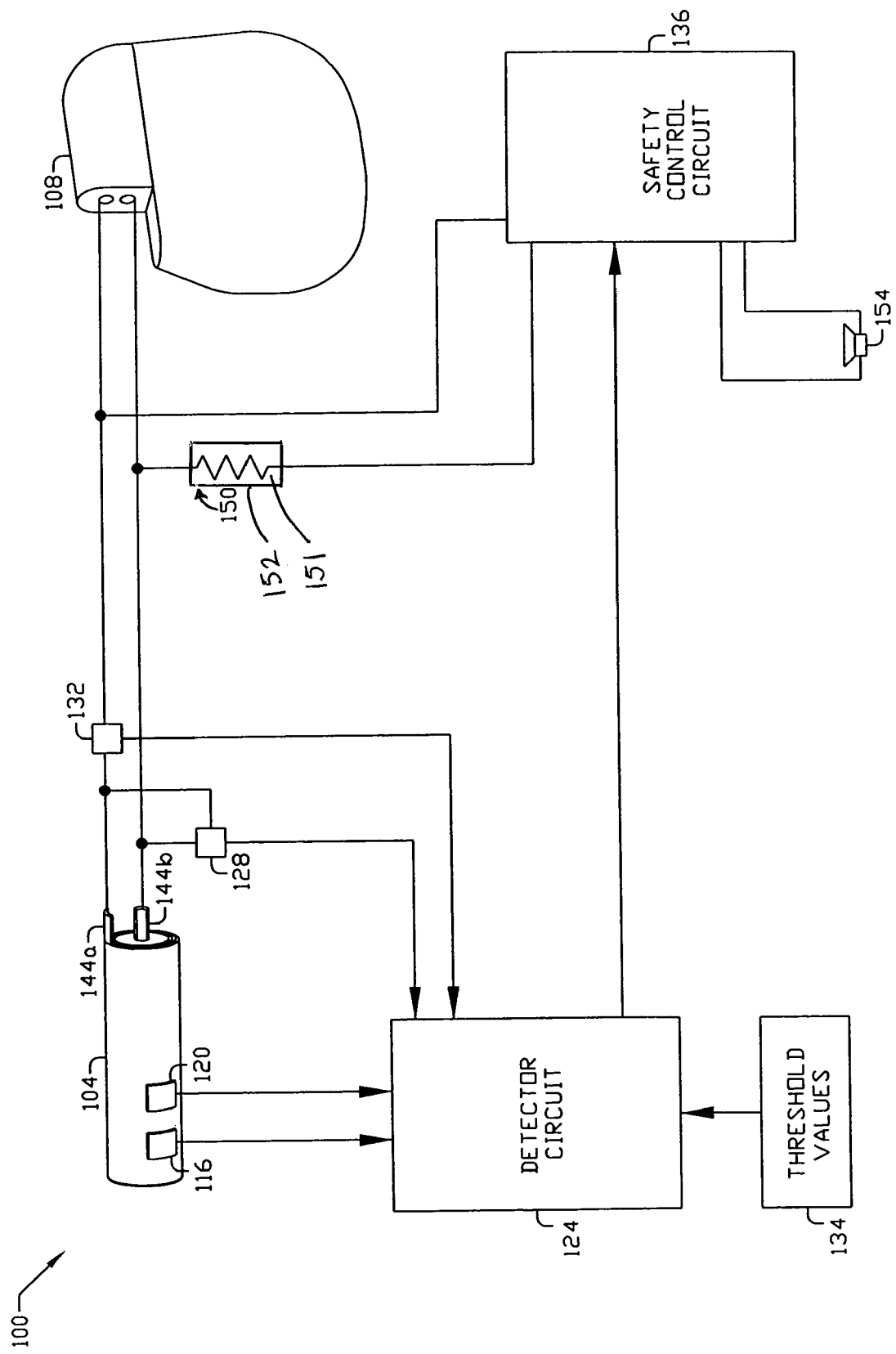
FIG. 1 is a schematic diagram illustrating the best mode of the present invention.

Referring to the drawings, FIG. 1 is a schematic diagram illustrating the best mode of the claimed safety circuit 100 having a battery 104 powering an external device 108 (such as a spinal cord stimulator). Sensors 116 and 120 detect temperature and pressure respectively, and are connected to a detector circuit 124, which also measures voltage 128 across and current 132 traveling through the battery 104. Predetermined threshold values 134 are stored in the memory of the detector circuit 124 and, in the event of an internal fault in the battery (e.g., over-heating of excessive pressure in, or high current flow through the battery), the detector circuit 124 signals the safety control circuit 136 to initiate an emergency energy discharge sequence including connection of the terminals 144a and 144b of the battery 104 to an energy discharge device 150. Heat generated by the discharge is absorbed by a heat absorbing material 151, preferably an endothermic phase-change material such as paraffin, which is thermally coupled to the energy discharge device 150 and encapsulated by a biocompatable sealed enclosure 152. Simultaneously, the safety control circuit 136 initiates an alert signal device 154 to alert the operator or user that a failure has taken place. The safety control circuit 136 may control the rate of discharge of energy from the battery 104 by pulsing (alternatingly connecting and disconnecting) the battery 104 from the discharge device 150.

The use of endothermic phase-change heat absorbing materials 151 to absorb heat generated by an emergency energy discharge is intended to prevent over-heating of adjacent tissue. The amount of heat energy Q that can be absorbed by the heat absorbing material 151 is of course dependent on the quantity and characteristics of the heat absorbing material used. This relationship can be expressed as:

$$Q = \int_{T_I}^{T_f} C_P \, dT + \Delta H_f$$

where Q represents heat energy absorbed (J/g), $T_I$ represents initial temperature (° C.), $T_F$ represents final temperature (° C.), $C_P$ represents the heat capacity of the heat absorbing material mass (J/g-K), and $H_f$ represents the latent heat of fusion (J/g).

Table 1 depicts properties of a preferred heat absorbing material, paraffin, as compared to other materials typically used in batteries in two different temperature ranges. Also shown are properties of alternative, but less effective materials polypropylene and polyethylene. Still other alternative heat absorbing materials can be used; e.g., Aerogel (SiO$_2$) or water. Note that in the range of room temperature (25° C.) to 100° C. and in the range of body temperature (37° C.) to 100° C., a large portion of the heat absorbed by the paraffin occurs during melting of the paraffin, in which 147 J/g are absorbed due to latent heat of fusion compared with 392 J/g or 352 J/g total, respectively. By contrast, polypropylene and polyethylene never reach their melting point in this range; therefore, all heat absorption occurs due to heat capacity. Water has a relatively high heat capacity and can therefore absorb a large amount of heat prior to undergoing a phase change at its boiling point. A large portion of the latent heat of evaporation can be absorbed into the water at its boiling temperature without the water actually converting to steam.

TABLE 1

| | Heat Capacity (J/g-°C.) | Latent Heat of Fusion (J/g) | Melting Temp (°C.) | Latent Heat of Evap (J/g) | Boiling Temp (°C.) | Q (25°C.-100°C.) (J/g) | Q (37°C.-100°C.) (J/g) |
|---|---|---|---|---|---|---|---|
| Copper | 0.385 | | 1083 | | | 29 | 24 |
| Aluminum | 0.9 | | 658 | | | 68 | 57 |
| Paraffin | 3.26 | 147 | 58 | | | 392 | 352 |
| Polypropylene | 1.83 | 88 | 160 | | | 137 | 115 |
| Polyethylene | 1.78 | 276 | 142 | | | 134 | 112 |
| Water | 4.2 | 337 | 0 | 2259 | 100 | 315[l] 2574[v] | 265[l] 2524[v] |

Figure 2:
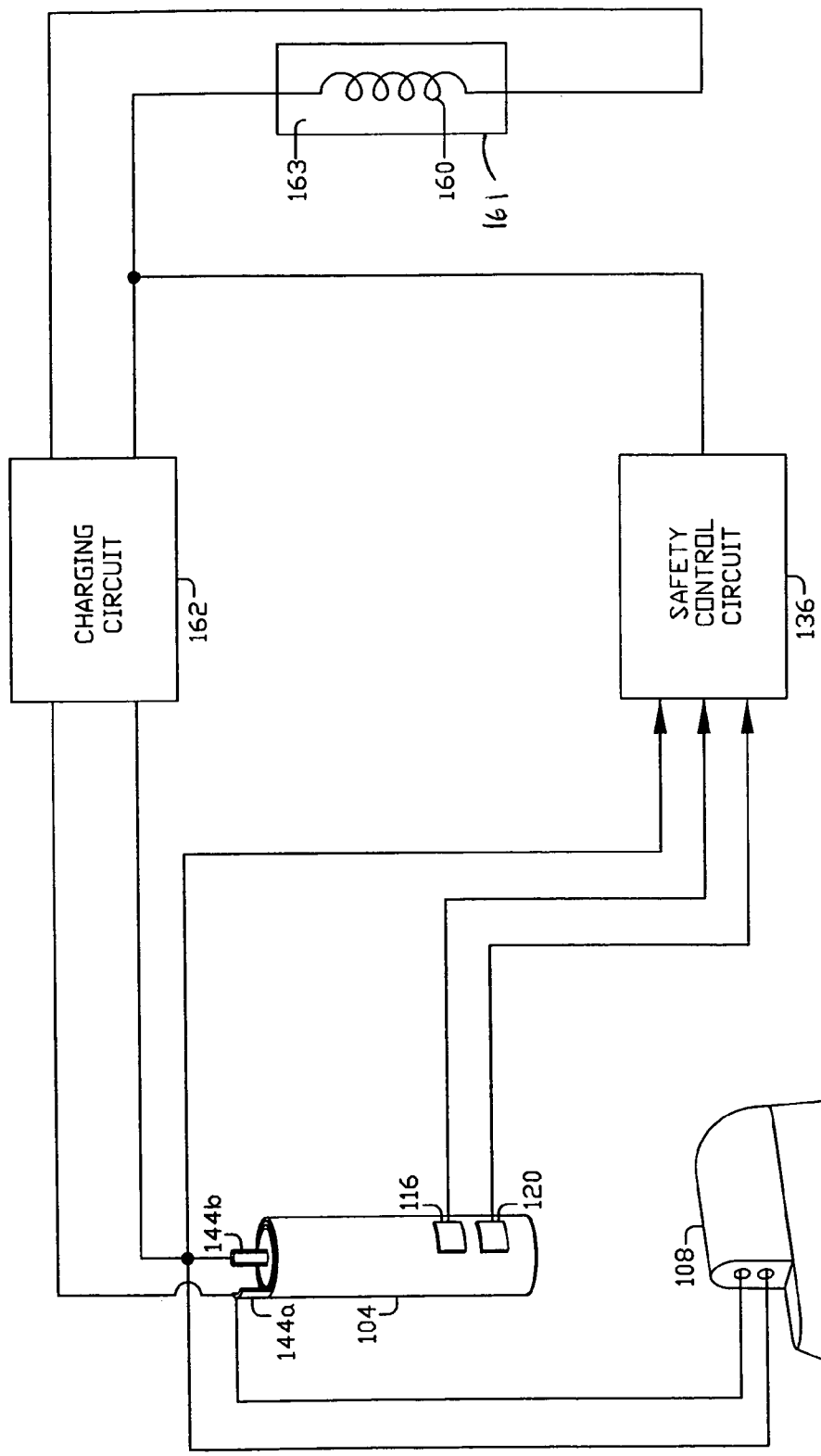
FIG. 2 is a schematic diagram of a battery incorporating an energy discharge circuit utilizing the secondary inductive charging coil in an implantable device as an energy discharge (dump) device.

[l]Q (J/g) to reach 100°C., remaining in liquid state
[v]Q (J/g) to reach vapor state FIG. 2 illustrates one implementation of the present invention in which the secondary inductive charging coil 160 (which normally functions to charge the battery 104 through a charging circuit 162) is used as the energy discharge device. In this example, when a faulty battery condition is detected by a thermocouple 116 or pressure switch 120, (indicating the existence of an internal short circuit or over-pressure), the safety control circuit 136 connects the inductive charging coil 160, across the terminals 144a and 144b of the failed battery causing it to dissipate energy from the battery 104 in the form of heat, thus preventing the battery 104 itself from heating to dangerous levels. The coil 160 is preferably surrounded by HAM 163 to protect adjacent tissue from damage resulting from heating of the coil 160 during an emergency discharge. Components other than or in addition to inductive charging coils may interchangeably be used as an emergency energy discharge device. For example, alerting devices such as sound generators (e.g., piezoelectric devices, horns, bells, etc.), vibrators, or lights may be used as part of the emergency discharge circuit, as well as other signaling devices known in the art. All discharge devices may be thermally coupled to heat absorbing endothermic phase-change material such as paraffin 163 enclosed in a biocompatable safety capsule 161.

Figure 3:
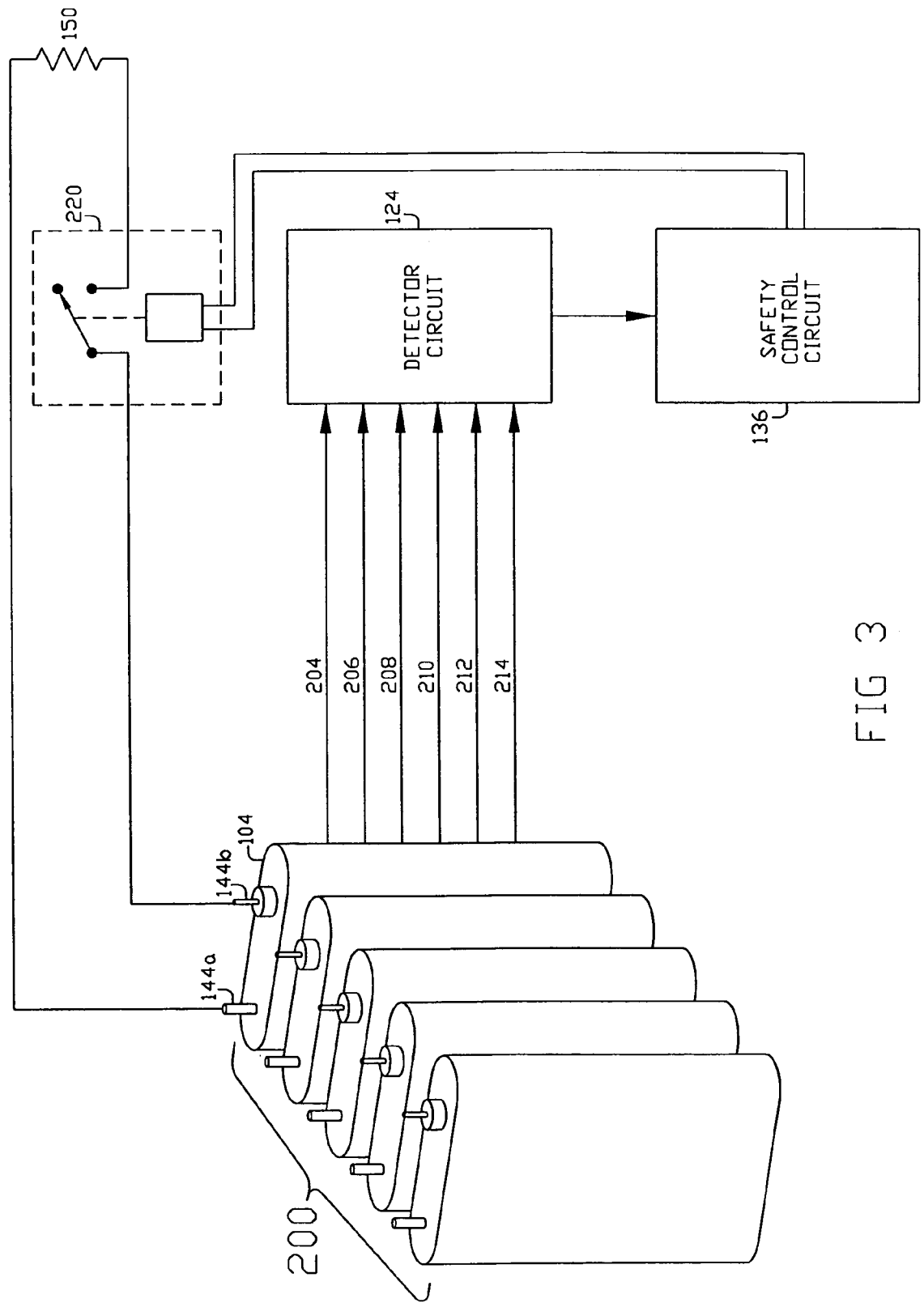
FIG. 3 is an illustration of the present invention implemented in a large battery array such as a submarine power source.

FIG. 3 illustrates the method of the present invention in a battery array 200 such as that used to power submarines and electric vehicles, and in power grid load leveling installations. Here, a detector circuit 124 monitors battery conditions including temperature 204, pressure 206, voltage 208, current 210, electrolyte specific gravity 212, and electrolyte level 214. These values are communicated to the safety control circuit 136, which is programmed to initiate an emergency discharge sequence in the event of a fault condition in a battery (internal short circuit or over-pressure). Specifically, if predetermined parameters, or combinations thereof, stored in the memory of the safety control circuit 136, are exceeded, the faulty battery 104 is isolated from the battery array 200 by bypassing the faulty battery 104 in the array circuit. Simultaneously or immediately thereafter, the safety control circuit 136 signals a relay 220 to connect the terminals 144a and 144b of the faulty battery 104 across an energy discharge load 150 such as a resistance heater. The safety control circuit 136 may be programmed to vary the drain rate by pulsing (connecting and disconnecting) the discharge or by adjusting the resistance of the load (variable resistor). The detector circuit 124 and safety control circuit 136 may be combined or integrated. Typically, they will comprise digital circuits, but may take the form of relatively simple electro-mechanical devices such as bimetal thermal switches or deformable pressure switches, both well known in the art. In such a case, over-temperature or excessive pressure would cause immediate direct connection of the terminals 144a and 144b across the energy discharge device 150.

Figure 4:
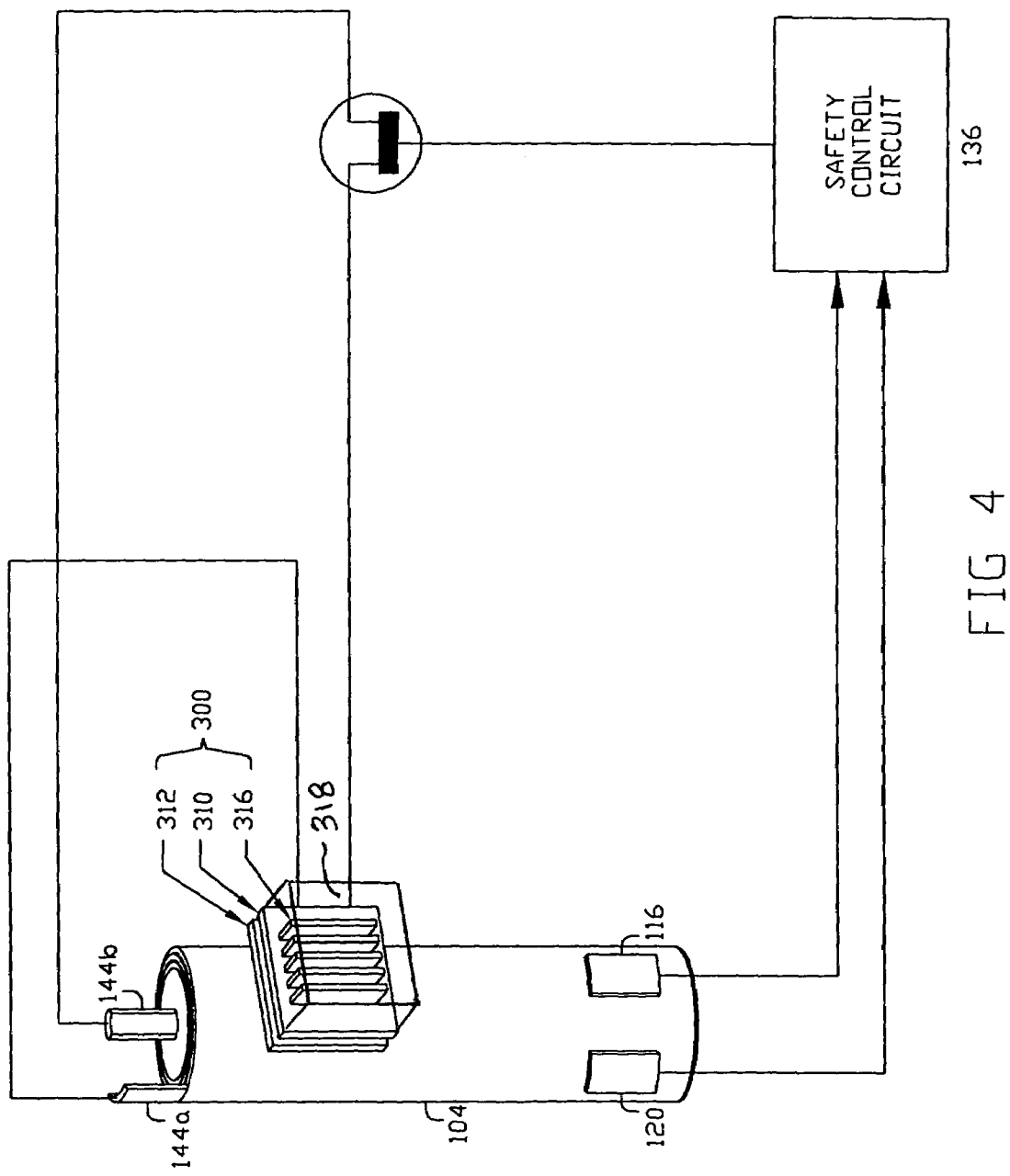
FIG. 4 illustrates the use of a Peltier device (sometimes referred to as a thermoelectric cooler) as an energy drain device.

FIG. 4 illustrates the use of a Peltier device 300 used as an energy discharge device. In the event of an internal short circuit in the battery 104, as detected by a thermocouple 116 or pressure transducer 120, the safety control circuit 136 connects the battery terminals 144 across the terminals of the Peltier device 300 causing one side 310 to heat-up and the other side 312 to cool down. By placing the cooled side 312 in thermal contact with the battery 104 and the heated side in thermal contact with a heat sink 316, the draining of excess heat from the battery may be accelerated using the remaining stored electrical energy in the battery, which drives the Peltier device 300 "heat pump." The hot side of the Peltier device may be placed in thermal contact with heat absorbing phase-change material such as paraffin 318.

Figure 5:
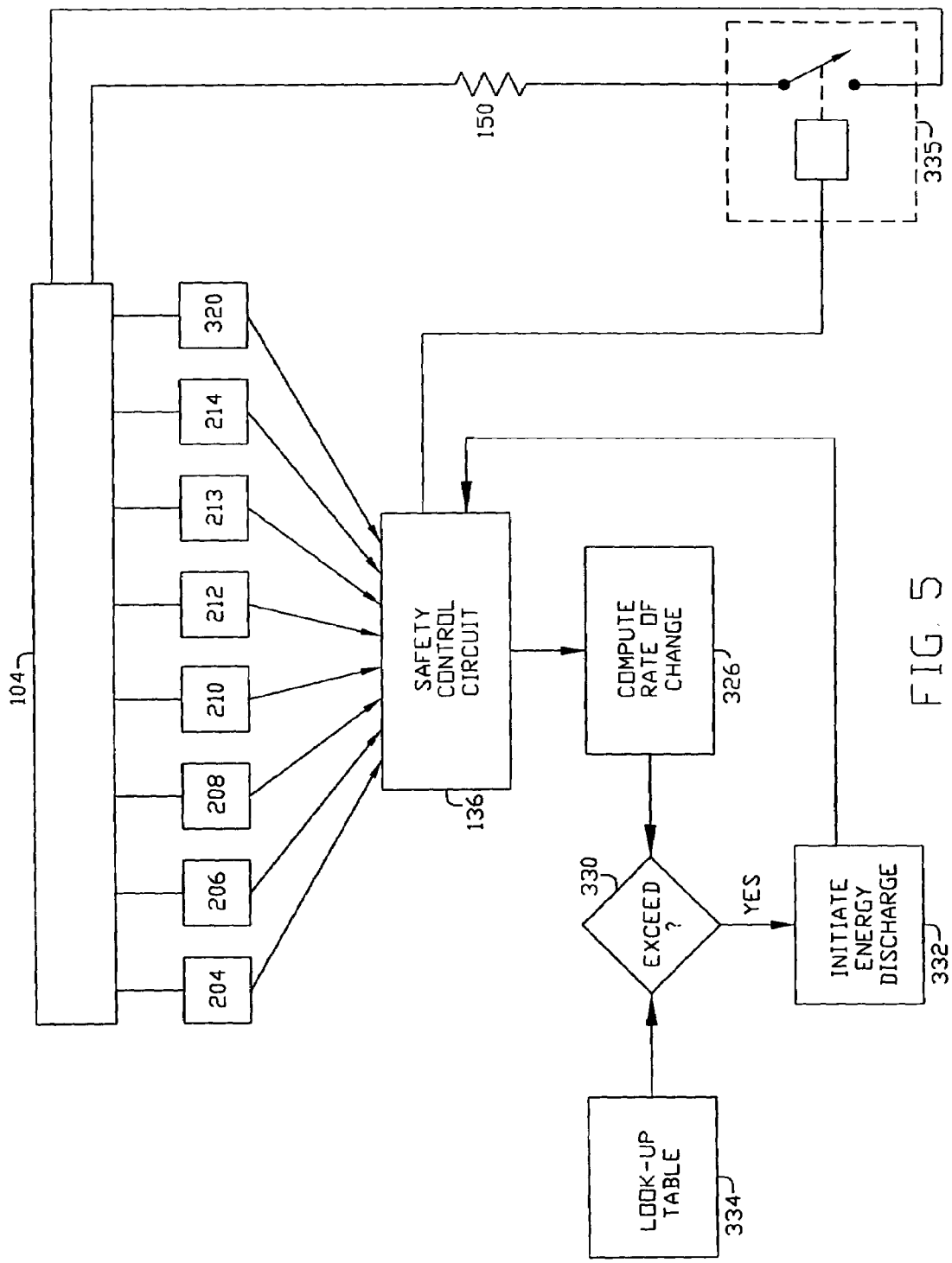
FIG. 5 is a logic flow and schematic diagram showing implementation of the best mode of the present invention.

FIG. 5 is a combined logic flow/schematic diagram illustrating the implementation of the present invention wherein a combination of battery parameters are monitored and applied to an algorithm to decide whether to initiate an emergency energy discharge sequence and, if so, control the rate. The greater the remaining charge in the battery, the more urgent is the need to drain remaining energy quickly. Therefore, the following algorithm may advantageously be used to control the rate of emergency energy discharge:

If $V_1 > V_2$ and Internal Short Detected, then Initiate Fast Discharge Mode;

If $V_1 \leq V_2$ and Internal Short Detected, then Initiate Slow Discharge Mode, Where $V_1$=battery voltage at time of fault
$V_2$=predetermined threshold voltage.

V2 would be set in terms of remaining energy. Normally V2 would be a voltage resulting from a remaining state of charge of approximately 70%, but can range from 50% to 95%. Additionally, multiple thresholds may be set to initiate a range of emergency energy discharge rates. Depending on the application, additional variations of this algorithm will be necessary. In some cases, the inverse may be required. For example, a battery with a greater charge but a moderate internal short (moderately-rising temperature or pressure) may initiate a slower emergency energy discharge rate than a battery with a lower remaining charge but a severe internal short (rapidly rising temperature or pressure).

In the example illustrated in FIG. 5, the safety control circuit 136 monitors voltage 208 of the battery 104, current 210 passing through the battery 104, internal battery impedance 320, battery temperature 204, internal battery pressure 206, and state of charge 212. Other well-known direct and indirect measures of the operating state of the battery may similarly be used such as measuring the amount of bulging of the battery enclosure. It then computes rates of change of each of the factors 326 and compares 330 them to a look-up table of acceptable or threshold values 334 stored in memory. The safety control circuit 136 then initiates an emergency energy discharge sequence if one or a combination of parameters in the values stored in the look-up table 334 are exceeded by the measured values. If an emergency energy discharge sequence is initiated, the safety control circuit 136 causes relay 335 to close the circuit connecting the battery 104 directly to the discharge device 150. The safety control circuit 136 can vary the rate of drain from the battery to maintain safe temperatures of the battery and the energy drain device. For example, the rate of drain of the battery may be a function of the remaining energy in the battery and the rate of increase in temperature 204 and/or pressure 206 of the battery. The rate of drain may be a function of one or of a combination of the following factors: voltage 208, change in voltage, rate of change in voltage, state of charge 212, temperature 204, change in temperature, rate of change in temperature, impedance 320, change in impedance, rate of change in impedance, pressure 206, change in pressure, rate of change in pressure, electrolyte pH 213, and/or electrolyte specific gravity 214. Such rate of emergency energy discharge may be linear, non-linear, continuous, or intermittent. State of charge is typically determined as a function of a battery's open circuit voltage, usually integrated over a period of time. However, state of charge may also be measured by such means as specific gravity of electrolyte and other methods well-known in the art.

Figure 6:
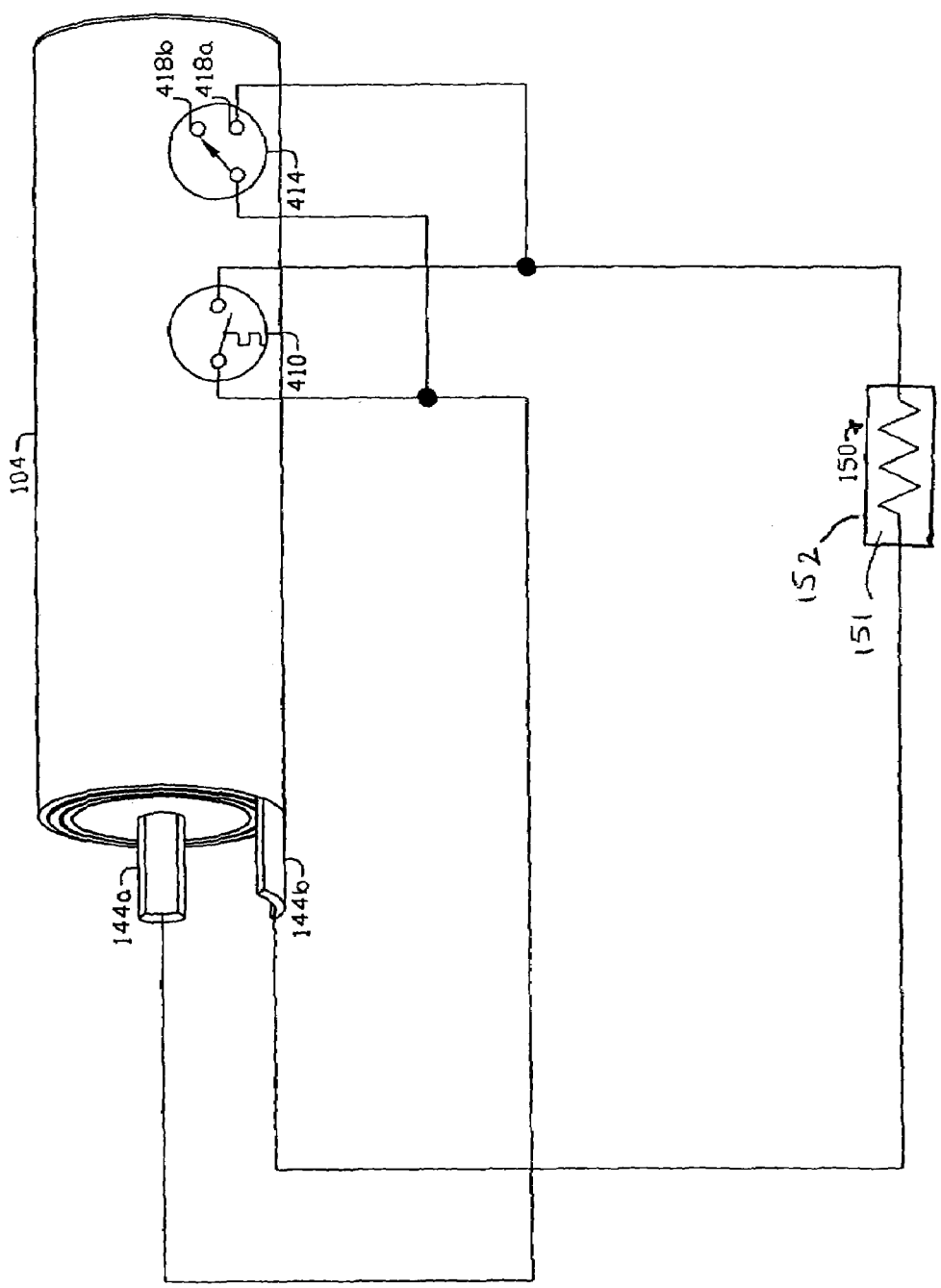
FIG. 6 is a schematic diagram of the present invention using a simple bimetal temperature-sensing switch and a mechanical pressure-sensing switch as the triggering devices to initiate an emergency energy discharge.

FIG. 6 illustrates the simplest form of implementing the present invention as an automated device. Here, when a simple electro-mechanical device such as a bimetal switch reaches a threshold temperature, it connects the terminals 144*a* and 144*b* of the battery 104 to a discharge device 150. Similarly, a pressure-activated switch 414 could initiate the drain of energy from the battery by simply being activated by pressure built-up in the battery, pushing contacts 418*a* and 418*b* closed causing connection of the terminals 144*a* and 144*b* of the battery 104 to the energy discharge load 150, which is surrounded by a heat absorbing endothermic phase-change material 151 such as paraffin and encapsulated in a sealed enclosure 152.

Figure 7:
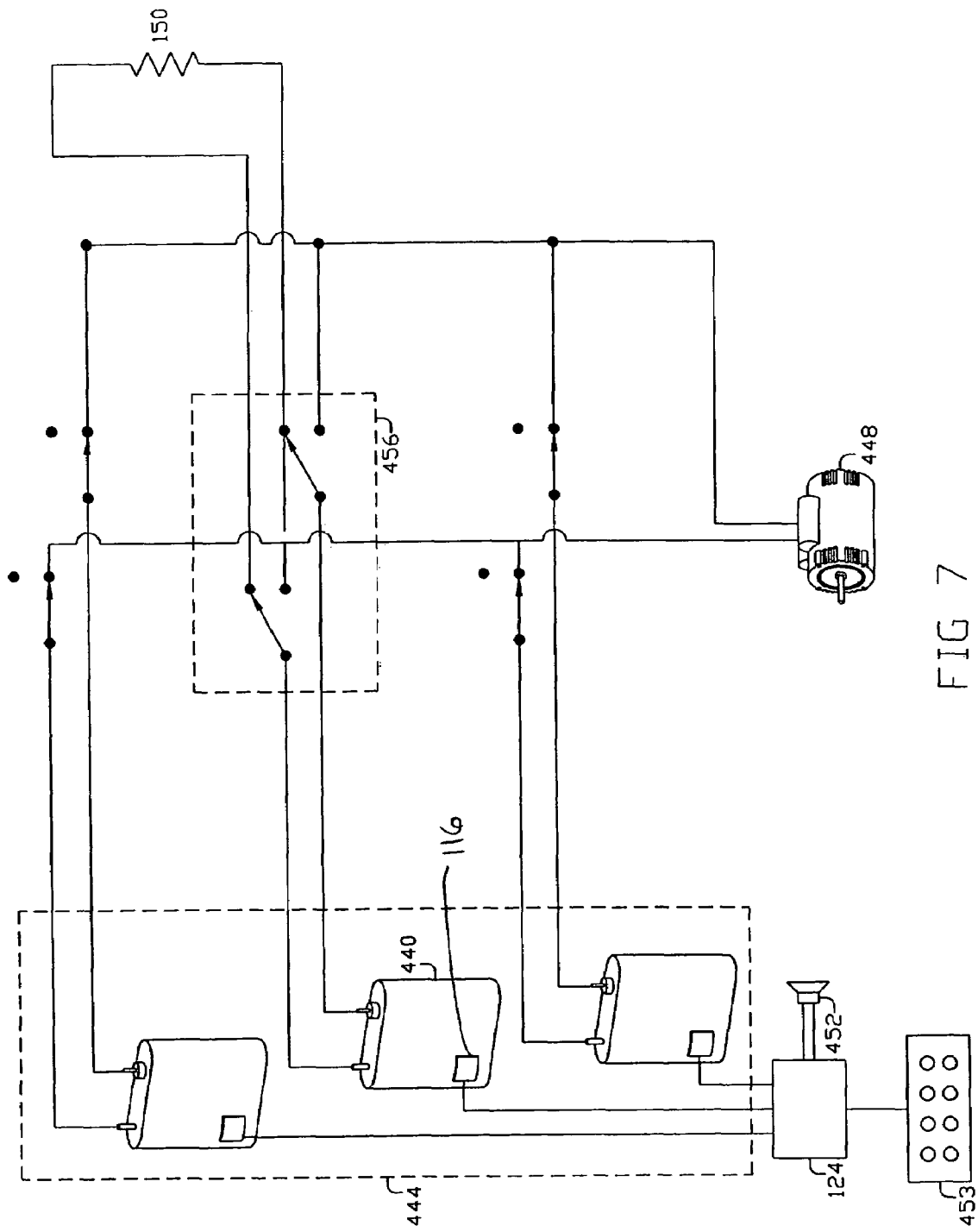
FIG. 7 is a schematic diagram of the present invention implemented as a manually-operated system on a submarine.

As illustrated by FIG. 7, although this invention is best implemented as an automated system, it can also be manually operated where appropriate. In this example, if an internal fault such as overheating is detected by a sensor 116 and a detector circuit 124 in a faulty battery 440 in a large battery array 444 such as powering a submarine drive motor 448, the operator may, upon receiving a signal from an alarm 452 or a display 453, manually isolate the faulty battery 440 using an isolation switch 456, then connect it to an emergency energy discharge load 150. Additionally, discharge loads can take the form of any device that converts energy stored in a battery to another form of energy. For example, the stored energy could be converted into heat (e.g., resistance heater), electromagnetic (e.g., light bulb), kinetic (e.g., flywheel), chemical (e.g., charge another battery), or potential energy (e.g., wind a spring). Obvious to one skilled in the art should be that this implementation of the present invention would be applicable in a wide range of installations, including, but not limited to, power grid load-leveling installations, photovoltaic storage banks, and the like.

Figure 8:
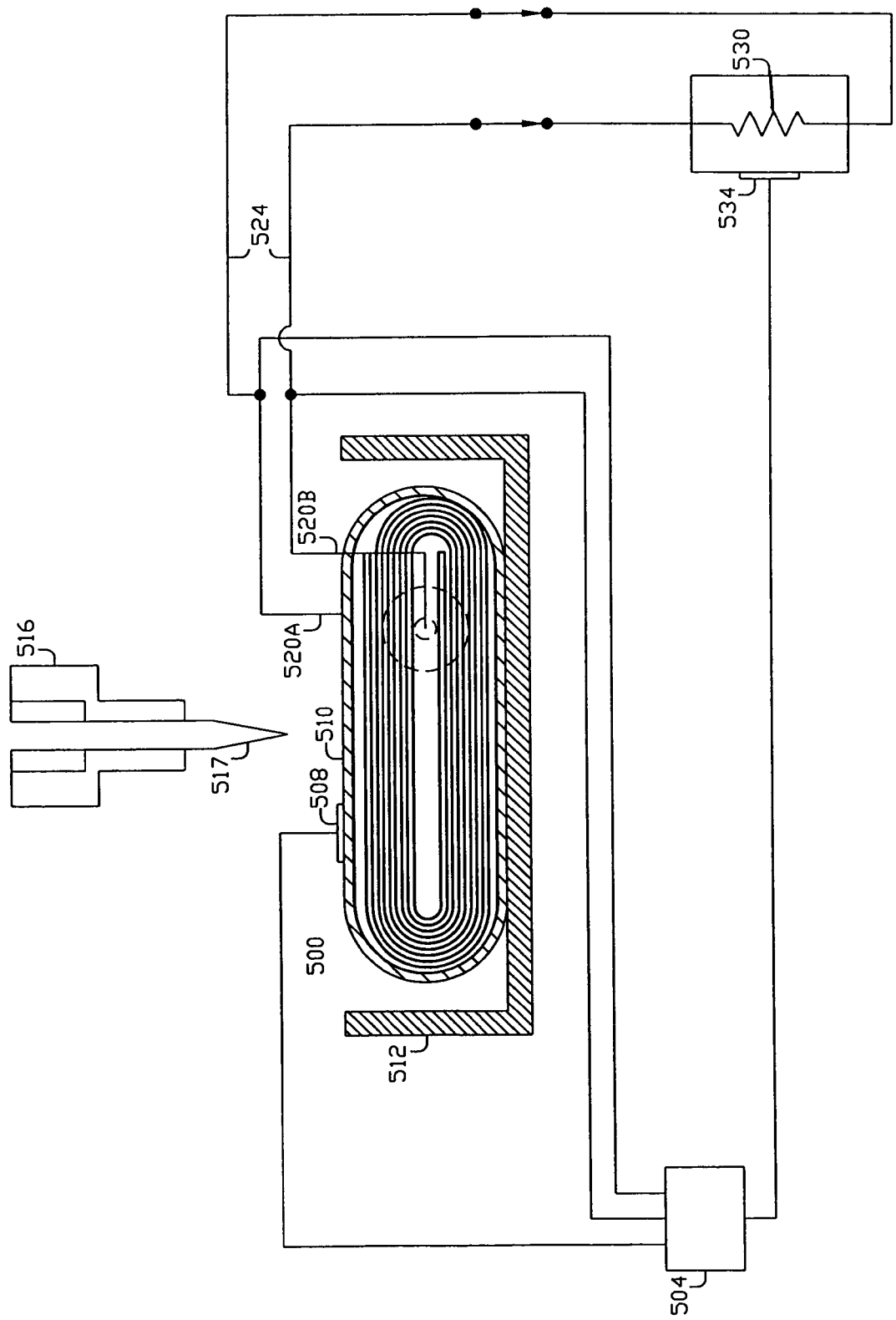
FIG. 8 is a schematic diagram illustrating the method used for testing the present invention in actual batteries.

FIG. 8 is a schematic diagram of the set-up that was used to test the present invention. In tests, a fully charged 320-mAh lithium ion cell 500 with liquid electrolyte was connected to a Yokogawa MobileCorder MV100 recording voltmeter 504. A type K thermocouple 508 was attached to the battery case 510 and connected to the recording voltmeter, which was calibrated to record temperature measured by the thermocouple. The battery was placed in a jig 512 designed to minimize conductive heat loss, limiting heat dissipation to convective loss. A remotely operated pneumatic ram 516 quickly drove a nail 517 through the battery.

In addition, the terminals 520*a* and 520*b* of the battery 500 were connected to wires 524 leading to a resistor 530. A second thermocouple 534 was bonded to the resistor. The test protocol was to activate the ram 516, penetrating the battery 500 with a nail 517, then, one second later, close the circuit across the battery terminals 520*a* and 520*b* through the resistor 530.

Figure 9:
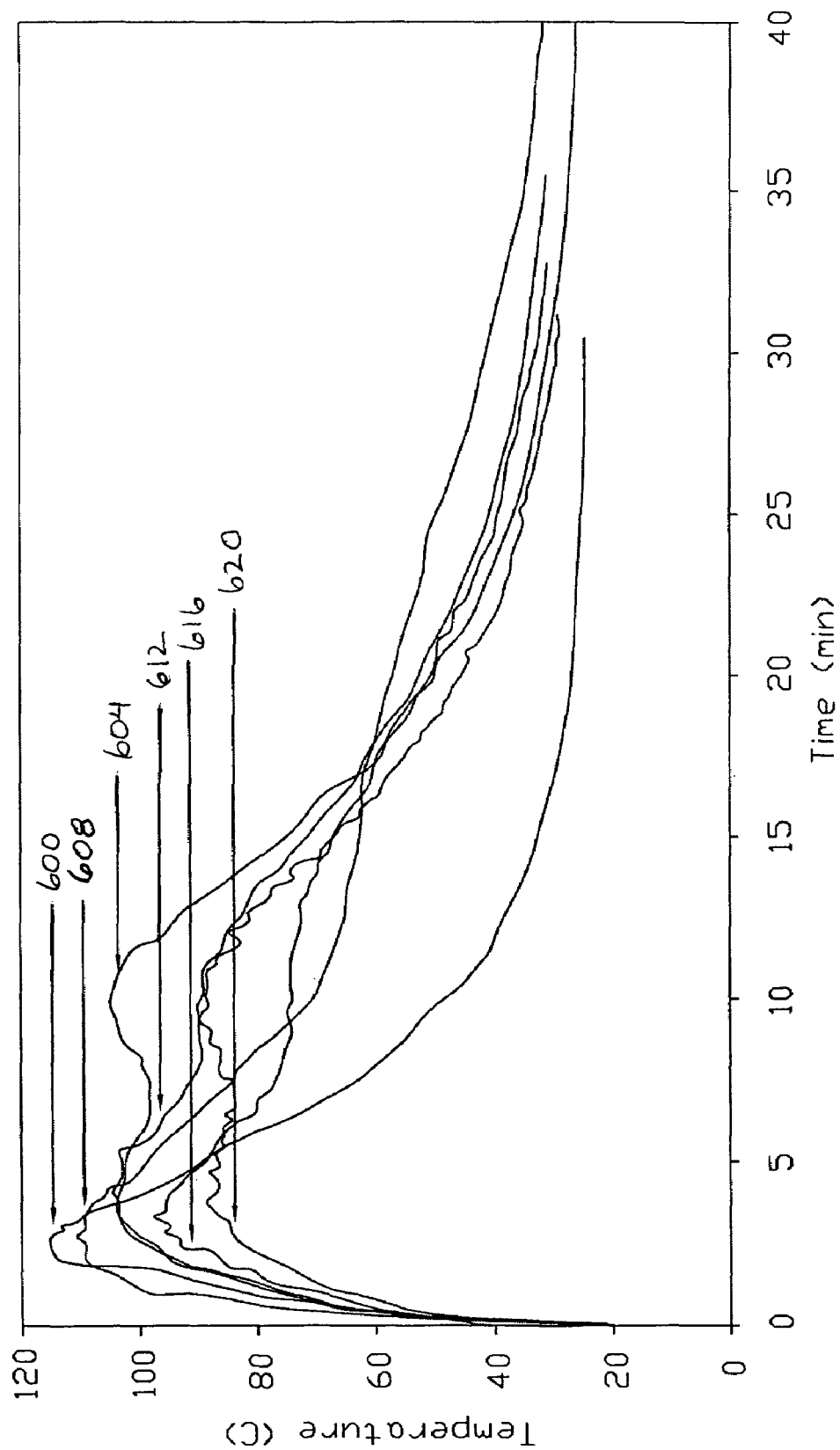
FIG. 9 is a time vs. temperature graph showing the results of controlled testing of the present invention during a nail penetration test.

FIG. 9 discloses the results of testing of the present invention. Trace 600 reflects the battery temperature for a pure nail penetration (no external energy discharge circuit). Its temperature peaked at approximately 118° C. (244° F.) in approximately 3 minutes, then gradually dropped to ambient temperature over approximately 25 minutes.

Trace 604 illustrates a similar test showing a "pure external short." That is, the terminals 520 were connected with a near zero ohm resistance wire, and no nail penetration was initiated. In this case, the battery temperature rose to 105° C. (221° F.) in approximately 4 minutes, and remained at or above 100° C. (212° F.) for almost 10 minutes. This cell did not reach ambient temperature for over 35 minutes.

Trace 608 reflects the result of a nail penetration test with a 10 ohm resistor connected across the terminals of the battery one second after the cell was penetrated by a nail. In this case, the battery case temperature rose to 115° C. (239° F.) in 4 minutes, then gradually dropped to ambient temperature in over 35 minutes.

Trace 612 reflects the results of a nail penetration test with a 1 ohm resistor connected across the terminals of the battery one second after the cell was penetrated by a nail. In this case, the battery case temperature rose to 112° C. (234° F.) in 4.5 minutes, then gradually dropped to ambient temperature in approximately 30 minutes.

Trace 616 reflects the results of a nail penetration test with a 0.47 ohm resistor connected across the terminals of the battery one second after the cell was penetrated by a nail. In this case, the battery case temperature rose to 99° C. (212° F.) in 3 minutes, then gradually dropped to ambient temperature in approximately 30 minutes.

Trace 620 reflects the results of a nail penetration test with a 0.008 ohm wire connected across the terminals of the battery one second after the cell was penetrated by a nail. In this case, the battery case temperature rose to 85° C. (185° F.) in 4 minutes, stayed relatively level below 90° C. (194° F.) for approximately 10 minutes, then rapidly dropped to ambient temperature in approximately 30 minutes.

There is a significant difference between the cell in trace 620 and that with no emergency energy drain in case 600, namely a peak temperature of 118° C. (244° F.) versus 90° C. (194° F.).

From these test data, it will be clear to those experienced in the art that, after an internal short is detected, quickly draining remaining energy from the battery by deliberately connecting the external terminals across an electrically resistive circuit presents a significant benefit versus merely allowing the battery to reach its peak temperature as current flows between anode and cathode inside the battery through a small internal pathway. These data indicate that, in the event of an internal short, a low (or near zero) resistance external short implemented quickly can prevent overheating leading to catastrophic failure of the battery enclosure. Initiating the emergency energy discharge more quickly after nail penetration would further reduce the peak battery temperature.

The specific implementations disclosed above are by way of example and for enabling persons skilled in the art to implement the invention only. We have made every effort to describe all the embodiments we have foreseen. There may be embodiments that are unforeseeable and which are insubstantially different. We have further made every effort to describe the invention, including the best mode of practicing it. Any omission of any variation of the invention disclosed is not intended to dedicate such variation to the public, and all unforeseen and insubstantial variations are intended to be covered by the claims appended hereto. Accordingly, the invention is not to be limited except by the appended claims and legal equivalents.

We claim:

1. A method for discharging a battery, comprising:
    employing electronics to electronically monitor an output from a sensor,
        the output indicating one or more operating states of a battery,
        the electronics and the sensor being different components; and
    employing the electronics to initiate a discharge of energy stored in the battery in response to the one or more operating states failing to meet one or more parameters that indicate safety of the battery.

2. The method of claim 1, wherein an operating state failing to meet the one or more parameters includes the operating state crossing a threshold.

3. The method of claim 1, further comprising:
    comparing at least one of the operating states to one or more of the parameters.

4. The method of claim 1, wherein discharging the energy stored in the battery includes converting the stored energy from one form of energy into another form of energy.

5. The method of claim 1, wherein initiating the discharge of energy stored in the battery includes converting the stored energy from electrical to one or more of the following energy forms: heat, electromagnetic radiation, kinetic, potential, and chemical.

6. The method of claim 1, wherein at least one of the one or more parameters is a function of at least one of the following: voltage, change in voltage, rate of change in voltage, current, change in current, rate of change in current, state of charge, change in state of charge, rate of change in state of charge, temperature, change in temperature, rate of change in temperature, impedance, change in impedance, rate of change in impedance, pressure, change in pressure, rate of change in pressure, electrolyte pH, electrolyte specific gravity, amount of bulging of battery enclosure, change in amount of bulging of battery enclosure, and rate of change of amount of bulging of battery enclosure.

7. The method of claim 1, wherein the energy is discharged from the battery in direct proportion to the quantity of energy remaining in the battery.

8. The method of claim 1, wherein the energy is discharged from the battery in inverse proportion to the quantity of energy remaining in the battery.

9. The method of claim 1, wherein the energy is pulsed during discharge of the energy from the battery.

10. The method of claim 1, wherein initiating the discharge of energy stored in the battery includes adjusting resistance of a resistor, the resistor being configured to control the rate of energy discharge from the battery.

11. The method of claim 1, further comprising:
    initiating a notification signal after the one or more operating states fail to meet the one or more parameters that indicate safety of the battery.

12. The method of claim 1, wherein the energy is discharged to an energy discharge device.

13. The method of claim 12, wherein the energy discharge device includes a heat absorption material (HAM).

14. The method of claim 12, wherein the energy discharge device includes a coil.

15. The method of claim 1, wherein electronically monitoring the one or more operating states is performed by an electronic circuit.

16. The method of claim 1, wherein the sensor is configured to monitor a condition selected from a group consisting of voltage of the battery, current output by the battery, charge of the battery, temperature of the battery, impedance of the battery, pressure of the battery.

17. The method of claim 16, wherein increasing the electrical current output by the battery includes substantially short-circuiting the battery.

18. The method of claim 1, wherein the sensor provides an electrical output that indicates at least one condition selected from a group consisting of voltage of the battery, current output by the battery, charge of the battery, temperature of the battery, impedance of the battery, pressure of the battery.

19. The method of claim 1, wherein employing the electronics to initiate the discharge of energy stored in the battery includes increasing an electrical current output by the battery.

20. The method of claim 19, wherein the electrical current is increased such that the electrical current generates heat that causes a phase change in a phase-change material.

21. The method of claim 20, wherein the phase-change material is selected from a group consisting of paraffin polypropylene, polyethylene, $SiO_2$, and water.

22. The method of claim 1, further comprising:
    making a determination whether the one or more operating states fail to meet the one or more parameters.

23. The method of claim 22, wherein at least one of the parameters includes a threshold and making the determination includes comparing a value for one or more of the operating states to the threshold 24. The method of claim 1, wherein employing the electronics to initiate a discharge of energy includes using the electronics to engage a circuit that causes the discharge of energy and wherein the circuit the electronics, and the sensor each being different components.

25. An energy discharge system, comprising:
    electronics configured to monitor an output from a sensor,
        the output indicating one or more operating states of a battery,
        the electronics and the sensor being different components, and
        the electronics also being configured to initiate discharge of energy stored in the battery in response to the one or more operating states failing to meet one or more parameters that indicate safety of the battery.

26. The system of claim 25, wherein initiate discharging the energy stored in the battery includes engaging a circuit tat causes the discharge of energy,
    wherein the circuit, the electronics, and the sensor are different components.

27. The system of claim 25, wherein failing to meet the one or more parameters includes the operating state crossing a threshold.

28. The system of claim 25, wherein an operating state failing to meet the one or more parameters includes the operating state rising above a threshold.

29. The system of claim 25, wherein an operating state failing to meet the one or more parameters includes the operating state falling below a threshold.

30. The system of claim 25, wherein the electronics are further configured to compare at least one of the operating states to the one or more of the parameters.

31. The system of claim 25, wherein at least one of the one or more parameters is a function of at least one of the following: voltage, change in voltage, rate of change in voltage, current, change in current, rate of change in current, state of charge, change in state of charge, rate of change in state of charge, temperature, change in temperature or rate of change in temperature.

32. The system of claim 25, wherein at least one of the one or more parameters is a function of at least one of the following: impedance, change in impedance, rate of change in impedance, pressure, change in pressure, rate of change in pressure, electrolyte pH, electrolyte specific gravity, amount of bulging of battery enclosure, change in bulging of battery enclosure, and rate of change of amount of bulging of battery enclosure.

33. The system of claim 25, further comprising:
an energy discharge device configured to receive the energy discharged from the battery.

34. The system of claim 33, wherein the energy discharge device is configured to convert the energy from electrical energy into another form of energy.

35. The system of claim 33, wherein the energy discharge device is configured to convert the energy from electrical energy into one or more of the following energy forms: heat, electromagnetic radiation, kinetic, potential, and chemical.

36. The system of claim 33, wherein the energy discharge device includes a heat absorption material (HAM).

37. The system of claim 33, wherein the energy discharge device includes a coil.

38. The system of claim 25, wherein the electronics are configured to discharge the energy from the battery in direct proportion to the quantity of energy remaining in the battery.

39. The system of claim 25, wherein the electronics are configured to discharge the energy from the battery in inverse proportion to the quantity of energy remaining in the battery.

40. The system of claim 25, wherein the electronics are configured to pulse the energy during discharge of the energy from the battery.

41. The system of claim 25, wherein the electronics are configured to adjust resistance of a resistor during discharge of the energy from the battery, the resistor being configured to control the rate of energy discharge from the battery.

42. The system of claim 25, wherein the electronics are configured to initiate a notification signal after the one or more operating states fail to meet the one or more parameters that indicate safety of the battery.

43. The system of claim 25, wherein the sensor is configured to monitor a condition selected from a group consisting of voltage of the battery, current output by the battery, charge of the battery, temperature of the battery, impedance of the battery, pressure of the battery.

44. The system of claim 25, wherein sensor provides an electrical output that indicates at least one condition selected from a group consisting of voltage of the battery, current output by the battery, charge of the battery, temperature of the battery, impedance of the battery, pressure of the battery.

45. The system of claim 25, wherein the sensor is positioned outside of the battery.

46. The system of claim 25, wherein employing the electronics to initiate a discharge of initiating discharge of the energy stored in the battery includes increasing an electrical current output by the battery.

47. The system of claim 46. wherein a phase-change material is positioned to receive heat generated by the increased electrical current.

48. The system of claim 47, wherein the phase-change material has a melting point in a range of 42° C. and 80° C.

49. The system of claim 46, wherein the electronics are configured to increase the electrical current such tat the electrical current generates heat that causes a phase change in a phase-change material.

50. The system of claim 49, wherein the phase-change material has a melting point in a range of 42° C. and 80° C., 51. The system of claim 49, wherein the phase-change material is selected from a group consisting of paraffin, polypropylene, polyethylene, SiO.sub.2, and water.

52. The system of claim 46, wherein increasing the electrical current output by the battery includes substantially short-circuiting the battery.

53. The system of claim 25, further comprising:
electronics configured to make a determination whether the one or more operating states fail to meet the one or more parameters.

54. The system of claim 53, wherein at least one of the parameters includes a threshold and making the determination includes comparing a value for one or more of the operating states to the threshold.

55. The system of claim 25, wherein
the sensors is positioned outside of the battery and is configured to monitor a condition selected from a group consisting of voltage of the battery, current output by the battery, charge of the battery, temperature of the battery, impedance of the battery, pressure of the battery, the one or more sensors are positioned outside of the battery;
initiating discharge of the energy stored in the battery includes increasing an electrical current output by the battery,
a phase-change material is positioned to receive heat generated by the increased electrical current, the phase-change material has a melting point in a range of 42° C. and 80° C.,
the electronics being configured to increase the electrical current such that the electrical current generates heat that causes a phase change in the phase-change material.

* * * * *